United States Patent
Hasper et al.

(10) Patent No.: US 6,328,561 B1
(45) Date of Patent: Dec. 11, 2001

(54) METHOD FOR COOLING A FURNACE, AND FURNACE PROVIDED WITH A COOLING DEVICE

(75) Inventors: Albert Hasper, Meppel; Frank Huussen, Bilthoven; Theodorus Gerardus Maria Oosterlaken, Oudewater; Jack Herman Van Putten, Den Dolder, all of (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/381,428

(22) PCT Filed: Mar. 16, 1998

(86) PCT No.: PCT/NL98/00151

§ 371 Date: Sep. 13, 1999

§ 102(e) Date: Sep. 13, 1999

(87) PCT Pub. No.: WO98/41806

PCT Pub. Date: Sep. 24, 1998

(30) Foreign Application Priority Data

Mar. 14, 1997 (NL) .................................................. 1005541

(51) Int. Cl.$^7$ ...................................................... F27D 1/12
(52) U.S. Cl. ............................. 432/238; 432/4; 432/77; 432/197; 432/199; 432/200
(58) Field of Search .................. 432/4, 48, 77, 432/233, 238, 241, 197, 199, 200

(56) References Cited

U.S. PATENT DOCUMENTS

| | | |
|---|---|---|
| 2,257,229 | 9/1941 | Drake . |
| 2,397,810 | 4/1946 | Roof . |
| 3,035,824 | * 5/1962 | Weaver .................................. 432/48 |
| 3,622,135 | 11/1971 | Roth et al. . |
| 3,918,890 | 11/1975 | Blaine . |
| 4,348,174 | * 9/1982 | Spigarelli ................................ 432/1 |
| 4,351,805 | 9/1982 | Reisman et al. . |
| 4,430,055 | 2/1984 | Sugiyama . |
| 4,457,705 | * 7/1984 | Ramesohl et al. .................... 432/106 |
| 4,560,348 | 12/1985 | Moller et al. . |
| 4,925,388 | * 5/1990 | Iseki et al. .............................. 432/77 |

\* cited by examiner

Primary Examiner—Jiping Lu
(74) Attorney, Agent, or Firm—Knobbe, Martens, Olson & Bear, LLP

(57) ABSTRACT

A furnace includes a core tube that has an elongate boundary wall and is configured to accommodate wafers for processing the wafers in a treatment atmosphere. The furnace includes a cooling chamber defined between the elongate boundary wall and an outer casing of the furnace, wherein the outer casing includes a heating element and has first lateral, circumferentially spaced openings in proximity of a first end of the outer casing and second lateral, circumferentially spaced openings in proximity of a second end of the outer casing. Cooling gas is supplied through one of the first and second lateral, circumferentially spaced openings to a region of one end of the cooling chamber and provides for a cooling atmosphere. The cooling gas is guided along the cooling chamber with a uniform distribution of flow and discharged through one of the first and second lateral, circumferentially spaced openings from a region of an opposite end of the cooling chamber. A direction of flow of the cooling gas is periodically reversed during cooling, wherein the cooling gas is guided along an essentially closed circuit so that the cooling gas is preserved and so that the cooling atmosphere is separated from the treatment atmosphere. A liquid-gas heat exchanger cools the cooling gas.

11 Claims, 2 Drawing Sheets

METHOD FOR COOLING A FURNACE, AND FURNACE PROVIDED WITH A COOLING DEVICE

The present invention relates to a method for cooling a furnace and a furnace.

BACKGROUND OF THE INVENTION

A method of this kind is known from American U.S. Pat. No. 4,925,388, which describes a furnace in which, for cooling purposes, a gas is guided through the furnace either from above or from below. The direction of flow of the gas alternates, and this alternating movement is controlled by a number of valves. The gas moves in the space between the heating element and the core tube and in the space between the heating element and the insulation arranged at a distance therefrom. The air or other gas which is used as cooling medium is discharged via a fan.

It has been found that the discharge of such gases into a discharge system of a relatively large installation is accompanied by major drawbacks, since by definition these gases are hot and consequently can damage a discharge system of this kind, in particular if it is composed of plastic components. Moreover, harmful substances may be present in the gases.

The object of the present invention is to avoid this drawback and to provide a method which, on the one hand, allows rapid and uniform cooling and, on the other hand, does not subject the gas-discharge system to further loading.

An aspect of the invention involves a method for cooling a furnace having a core tube that has an elongate boundary wall and is configured to accommodate wafers for processing the wafers in a treatment atmosphere. The furnace includes a cooling chamber defined between the elongate boundary wall and an outer casing of the furnace, wherein the outer casing includes a heating element and has first lateral, circumferentially spaced openings in proximity of a first end of the outer casing and second lateral, circumferentially spaced openings in proximity of a second end of the outer casing. Cooling gas is supplied through one of the first and second lateral, circumferentially spaced openings to a region of one end of the cooling chamber and provides for a cooling atmosphere. The cooling gas is guided along the cooling chamber with a uniform distribution of flow and discharged through one of the first and second lateral, circumferentially spaced openings from a region of an opposite end of the cooling chamber. A direction of flow of the cooling gas is periodically reversed during cooling, wherein the cooling gas is guided along an essentially closed circuit so that the cooling gas is preserved and so that the cooling atmosphere is separated from the treatment atmosphere. A liquid-gas heat exchanger cools the cooling gas.

SUMMARY OF THE INVENTION

In principle, it would be possible to discharge the gas solely via the heat exchanger and to guide it into the gas-discharge system without using a closed circuit. However, the drawback of this is that it is constantly necessary to introduce additional gas and, in the case of air, this will generally emanate from the clean room, i.e., it will have been purified extensively. As a result, a particularly large installation for cleaning air is required, with all the associated costs. Moreover, it is undesirable to periodically withdraw air from or introduce air into a clean room.

If, in accordance with the invention, the gas is guided in a closed circuit with a heat exchanger, it is not necessary to constantly supply fresh gas, such as air. Moreover, it is possible as a result to make use of a gas having more specific properties, such as nitrogen. This is because basically there is no loss of gas, with the result that the extra costs of nitrogen or some other gas can be justified. The method according to the invention makes it possible to treat a greater number of wafers per hour, and the thermal loading to which each wafer is subjected will be reduced. Moreover, the treatment of the various wafers is more uniform.

It has been found that alternating the direction of flow of the cooling gas at a certain frequency enables the temperature gradient across the furnace to be limited as far as possible. It will be understood that the hottest part will now be situated in the centre of the furnace. Moreover, it has been found that the cooling rate can be increased considerably by comparison with designs in accordance with the prior art.

According to an advantageous embodiment of the invention, the reversal frequency of the flow of gas lies between 2 and 600 seconds, and more particularly between 5 and 60 seconds. Advantageously, the reversal frequency lies between 10 and 20 seconds. The above-described design makes it possible to achieve a cooling rate in the region of the wafers of approximately 50° C. per minute.

Another aspect of the invention involves a furnace assembly, comprising a furnace which is provided with a cooling device for using gas to cool the boundary wall of said furnace, a cooling chamber for gas being present in the region of said boundary wall, which chamber opens out on both sides into a line which is provided with valves, which valves comprise diverter valves, in order to move the gas alternately in one direction along said boundary wall and then in the opposite direction along said boundary wall, in which said diverter valves are connected to a closed circuit in which a liquid-gas heat exchanger is arranged.

According to an advantageous embodiment of the invention, the supply/discharge of gas is arranged in the outer casing of the furnace assembly, i.e. is effected via the wall and not via the end closures, such as the base or cover. This allows a more uniform distribution of flow to be achieved. This is because the movement of the gas in the gap between heating element and core tube is particularly difficult to control. However, this control is important if sufficient uniformity is to be ensured. This distribution of flow can be promoted further by introducing and discharging the gas via a number of openings which are arranged in a ring or other regular curve along the circumference of the furnace wall. These openings form a restriction to the gas flow and in fact locally determine the metering of the gas flow. By distributing these openings regularly along the wall, it is possible to ensure an even distribution of the gas flow, and hence an even dissipation of heat.

BRIEF DESCRIPTION OF THE DRAWINGS

It is possible to design each diverter valve as a single or double valve, provided that the natural convection is eliminated.

The invention will be explained in more detail below with reference to an exemplary embodiment depicted in the drawings, in which.

DETAILED DESCRIPTION OF THE INVENTION

Figure 1:
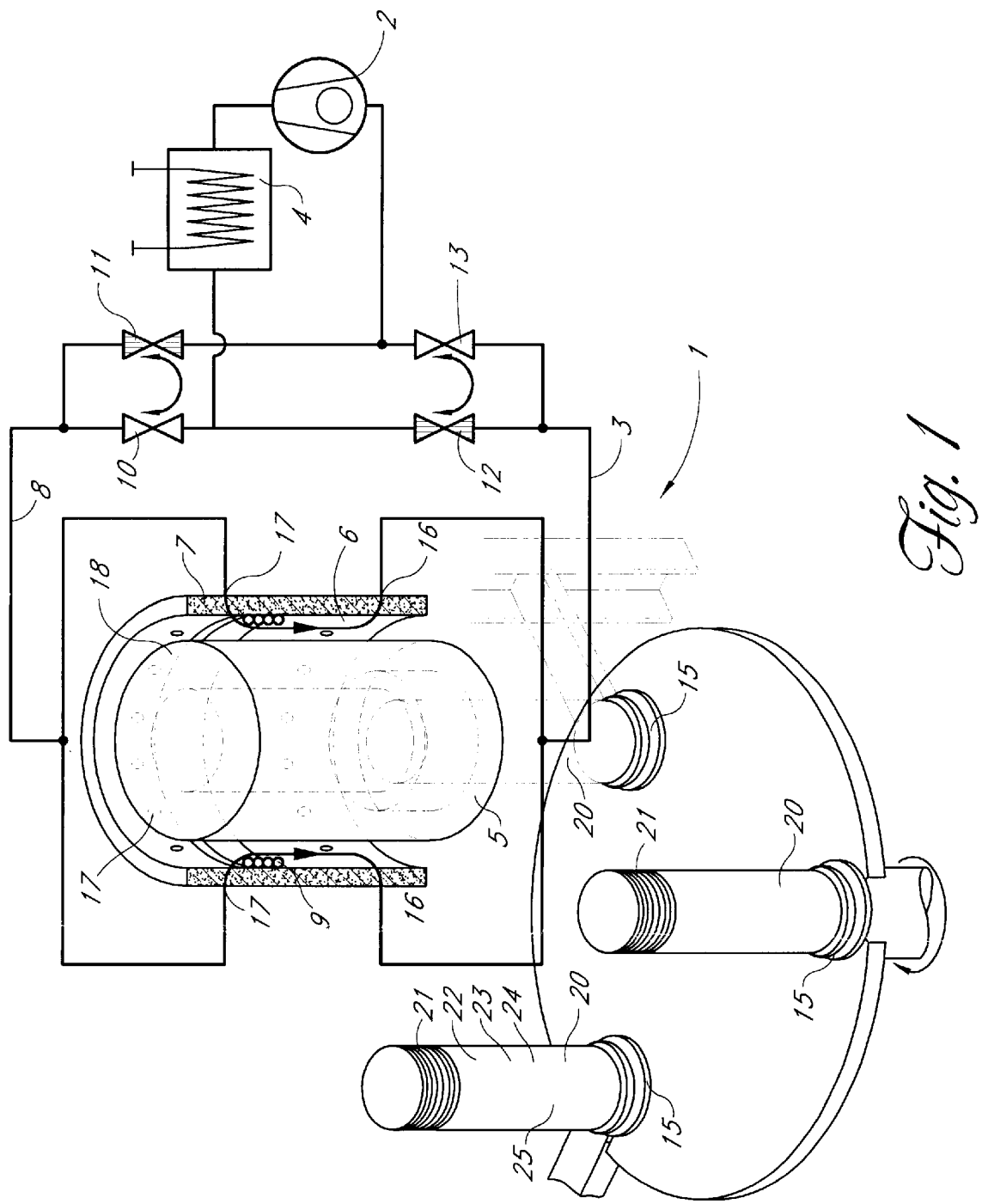
FIG. 1 diagrammatically illustrates the principle of the method and device according to the invention.

The treatment furnace according to the invention is denoted overall by 1, and is disposed in a treatment chamber which is otherwise depicted diagrammatically. This furnace comprises an outer casing 7 made, for example, of insulating material, against which a heating element 9 bears. A core tube 5 made, for example, of quartz material or silicon carbide is arranged at a distance from this diagrammatically depicted element 9, in which tube it is possible to accommodate a boat 20 provided with wafers 21–25. 18 denotes the top cover of the core tube. Wafer rack 20 is supported by cover 15, which can be moved up and down in a diagrammatically depicted manner in order to remove the boat 20 from the core tube 5. Between heating element 9 and core tube 5, there is arranged a gap 6, through which cooling gas, such as nitrogen, can be moved. Two series of approximately sixteen openings 16 and 17 each are arranged in outer casing 7. Lines 3 and 8, which are respectively connected to valves 12, 13 and 10, 11, are connected to these openings. These valves are in turn connected to a gas-liquid heat exchanger 4 and a fan 2.

The structure described above operates as follows. During cooling of treated wafers, in a first operating condition cool gas emanating from line 8 is introduced through openings 17 into the gap 6 between core tube 5 and heating element 9. This gas moves downwards in the direction of the illustrated arrow, and leaves the furnace in a heated state at 16, after which it is guided via pipe 3 and valve 12 to heat exchanger 4. After having been cooled, it is guided through fan 2 towards valve 11, and is then fed back into line 8 and then to the treatment furnace.

After a certain time, such as typically 20 seconds, the direction of flow is reversed by switching over the valves, i.e. closing the valves 11 and 12 and opening the valves 10 and 13. This means that cooling gas moves from line 3 and openings 16 towards openings 17 and line 8. From line 8, the gas passes through valve 10 towards heat exchanger 4 and, via fan 2 and valve 13, back into line 3.

Figure 2:
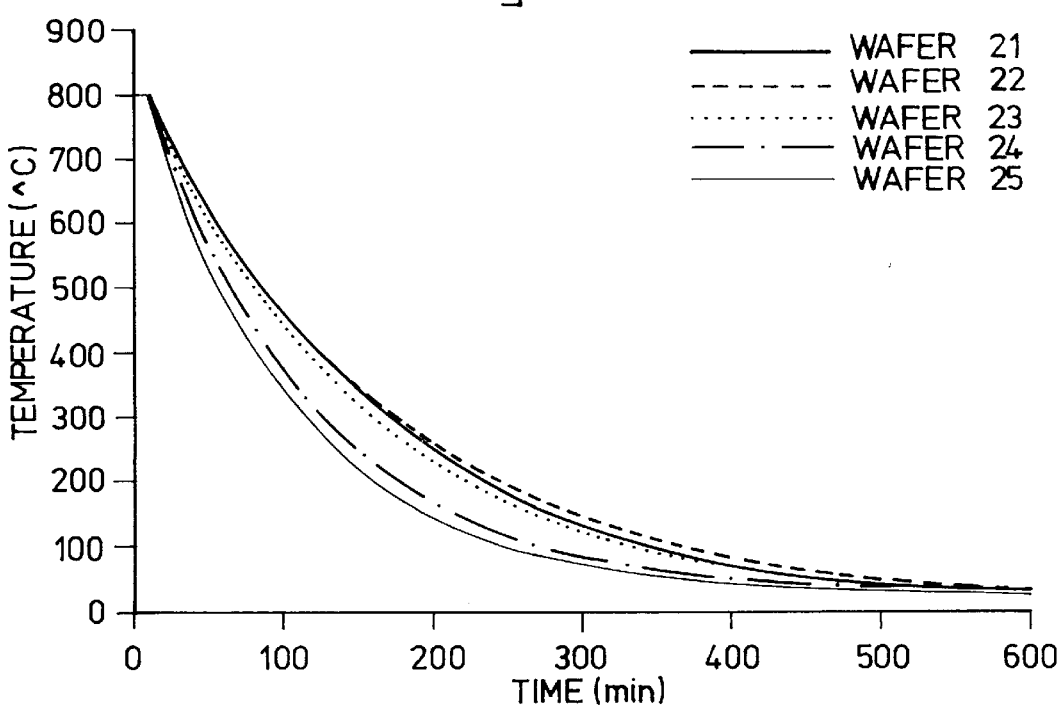
FIG. 2 shows temperature curves of a number of wafers in a conventional furnace during cooling.

If the valves 10, 11, 12 and 13 are closed, the design in accordance with the prior art would be the result. FIG. 2 shows a typical cooling rate for the wafers 21–25 in such a case.

The exit gas will be at a higher or lower temperature depending on the temperature of the furnace. A value of the exit gas (air) of 300–400° C. is mentioned by way of example. If this gas is discharged via a conventional outlet system, this results in two problems. Firstly, it is possible for low levels of pollutants, such as asbestos-like particles, or leakage gas to be present. Secondly, the increase in temperature frequently subjects the discharge system to impermissible loading. This applies in particular if the discharge system comprises components which are unable to withstand such high temperatures, such as plastic components. In such a case, a discharge device of this kind is designed to carry out cooling, with the result that extra cold air is used. This means that the discharge system has to be enlarged further in order to have sufficient capacity for such rapid cooling of a furnace.

In order to avoid these problems, it is now proposed to use the heat exchanger 4, which is connected to the liquid-cooling system of the production installation. In general, the heat which is gained as a result can be put to good use. In addition, an expensive gas can be used in the cooling circuit, since there is no consumption of this gas.

By arranging the openings 16 and 17 in series in the wall and introducing the cooling gas or air through these openings, it is possible to obtain an optimum distribution of flow. It is assumed here that the diameter of the openings 16, 17 determines the volume which flows through, i.e. the flow resistance in gap 6 is much lower than the flow resistance through these openings 16, 17. In designs in accordance with the prior art, the gas is introduced simply from above or below, and consequently it is impossible to ensure correct distribution of the cooling medium throughout gap 6, with the result that the temperature distribution is no longer uniform.

Figure 3:
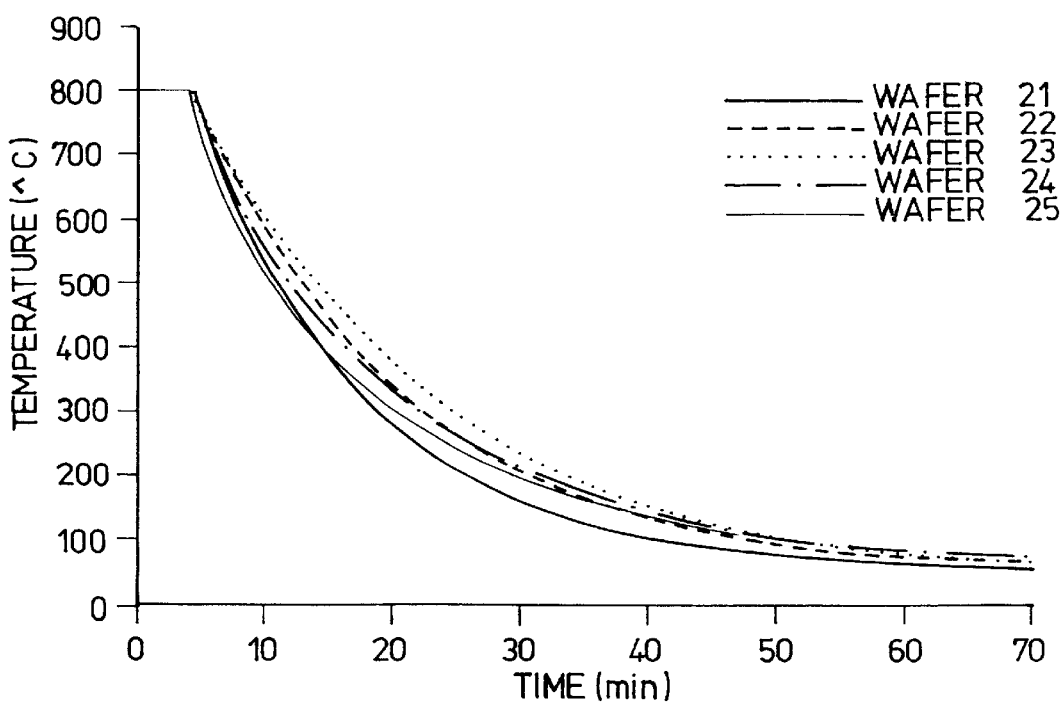
FIG. 3 shows temperature curves at various levels in a furnace according to the invention during rapid cooling.

FIG. 3 shows the cooling rate of the same wafers when the gas flow is reversed every 20 seconds in accordance with the invention.

A comparison between FIGS. 2 and 3 will firstly show that the cooling rate has increased by a number of times, so that the residence time in the furnace and the time for which the wafers are subject to elevated temperature are reduced considerably. Moreover, it is clear that the temperature spread between the wafers 21 and 25 has been limited to a considerable extent, so that more constant process conditions can be ensured.

Although the invention has been described above with reference to a preferred embodiment, it should be understood that it is possible for numerous modifications to be made to this preferred embodiment. For example, the gas inlet openings and gas outlet openings may be arranged at different positions over the height of the furnace, or may even open out at the top cover.

These and further variants, which will be obvious to the person skilled in the art after the above description has been read, lie within the scope of the appended claims.

What is claimed is:

1. A method for cooling a core tube of a furnace, the core tube having an elongate boundary wall and being configured to accommodate wafers for processing the wafers in a treatment atmosphere, the furnace having a cooling chamber defined between the elongate boundary wall and an outer casing of the furnace, wherein the outer casing includes a heating element and has first lateral, circumferentially spaced openings in proximity of a first end of the outer casing and second lateral, circumferentially spaced openings in proximity of a second end of the outer casing, comprising:

supplying a cooling gas through one of said first and second lateral, circumferentially spaced openings to a region of one end of said cooling chamber, wherein said cooling gas provides for a cooling atmosphere;

guiding said cooling gas along said cooling chamber, wherein said cooling gas has a uniform distribution of flow;

discharging said cooling gas through one of said first and second lateral, circumferentially spaced openings from a region of an opposite end of the cooling chamber;

periodically reversing a direction of flow of said cooling gas during cooling;

guiding said cooling gas along an essentially closed circuit so that the cooling gas is preserved and so that the cooling atmosphere is separated from the treatment atmosphere; and cooling said cooling gas through a liquid-gas heat exchanger.

2. The method according to claim 1, wherein the direction of flow is reversed in intervals between 2 and 600 seconds.

3. The method according to claim 1, wherein the direction of flow is reversed in intervals between 5 and 60 seconds.

4. The method according to claim 1, wherein the direction of flow is reversed in intervals between 10 and 20 seconds.

5. The method according to claim 1, wherein the furnace is cooled at a rate of approximately 50° C./min.

6. The method according to claim 1, wherein the gas is supplied and discharged through said boundary wall in a metered fashion.

7. The method according to claim 1, wherein said gas comprises nitrogen.

8. A furnace assembly, comprising:

a furnace having an outer casing, a core tube located within the outer casing and a cooling chamber existing between the outer casing and the core tube, the core tube having an elongate boundary wall and being configured to accommodate wafers for processing in a treatment atmosphere, wherein the outer casing includes a heating element and has first lateral, cirucumferentially spaced openings in proximity of a first end of the outer casing and second lateral, circumferentially spaced openings in proximity of a second end of the outer casing;

a gas line coupled to said first and second lateral, circumferentially spaced openings to provide for communication with the cooling chamber at a first end and a second end of the furnace to supply and to discharge a cooling gas that cools the boundary wall of the core tube and that has a uniform distribution of flow within the cooling chamber, the gas line including valves that comprise diverter valves to direct the cooling gas alternately in one direction along the boundary wall and then in an opposite direction along the boundary wall; and a liquid-gas heat exchanger in communication with the diverter valves forming a closed circuit for the cooling gas so that the cooling gas is preserved and so that the cooling atmosphere is separated from the treatment atmosphere.

9. The furnace assembly according to claim 8, wherein a fan is arranged downstream of the heat exchanger.

10. A method for cooling a core tube of a furnace, the core tube having an elongate boundary wall and being configured to accommodate wafers for processing the wafers in a treatment atmosphere, the furnace having a cooling chamber defined between the elongate boundary wall and an outer casing of the furnace, wherein the outer casing includes a heating element and has at least one first opening in proximity of a first end of the outer casing and at least one second opening in proximity of a second end of the outer casing, wherein the cooling chamber is closed at the first and second ends, comprising:

supplying a cooling gas through one of said first and second openings to a region of one end of said cooling chamber, wherein said cooling gas provides for a cooling atmosphere;

guiding said cooling gas along said cooling chamber, wherein said cooling gas has a uniform distribution of flow;

discharging said cooling gas through one of said first and second openings from a region of an opposite end of the cooling chamber;

periodically reversing a direction of flow of said cooling gas during cooling;

guiding said cooling gas along a closed circuit so that the cooling gas is preserved and so that the cooling atmosphere is separated from the treatment atmosphere; and cooling said cooling gas through a liquid-gas heat exchanger.

11. A furnace assembly, comprising:

a furnace having an outer casing, a core tube located within the outer casing and a cooling chamber existing between the outer casing and the core tube, the core tube having an elongate boundary wall and being configured to accommodate wafers for processing in a treatment atmosphere, wherein the outer casing includes a heating element and has at least one opening in proximity of a first end of the outer casing and at least one second opening in proximity of a second end of the outer casing, wherein the cooling chamber is closed at the first and second ends;

a gas line coupled to said first and second openings to provide for communication with the cooling chamber at a first end and a second end of the furnace to supply and to discharge a cooling gas that cools the boundary wall of the core tube and that has a uniform distribution of flow within the cooling chamber, the gas line including valves that comprise diverter valves to direct the cooling gas alternately in one direction along the boundary wall and then in an opposite direction along the boundary wall; and a liquid-gas heat exchanger in communication with the diverter valves forming a closed circuit for the cooling gas so that the cooling gas is preserved and so that the cooling atmosphere is separated from the treatment atmosphere.

* * * * *